(12) United States Patent
Stott et al.

(10) Patent No.: US 7,229,497 B2
(45) Date of Patent: Jun. 12, 2007

(54) METHOD OF PREPARING NANOCRYSTALS

(75) Inventors: Nathan E. Stott, Cambridge, MA (US);
Klavs F. Jensen, Lincoln, MA (US);
Moungi G. Bawendi, Boston, MA
(US); Brian K. H. Yen, Boston, MA
(US)

(73) Assignee: Massachusetts Institute of Technology, Cambridge, MA (US)

( * ) Notice: Subject to any disclaimer, the term of this patent is extended or adjusted under 35 U.S.C. 154(b) by 209 days.

(21) Appl. No.: 10/921,306

(22) Filed: Aug. 19, 2004

(65) Prior Publication Data

US 2005/0112849 A1    May 26, 2005

Related U.S. Application Data

(60) Provisional application No. 60/497,706, filed on Aug. 26, 2003.

(51) Int. Cl.
*C30B 25/12*    (2006.01)

(52) U.S. Cl. .............................. 117/68; 117/11; 117/75; 977/720

(58) Field of Classification Search ................ 117/68, 117/3, 11, 75; 977/762, 720; 428/402
See application file for complete search history.

(56) References Cited

U.S. PATENT DOCUMENTS

| | | | |
|---|---|---|---|
| 5,147,841 A | 9/1992 | Wilcoxon |
| 5,262,357 A | 11/1993 | Alivisatos et al. |
| 5,293,050 A | 3/1994 | Chapple-Sokol et al. |
| 5,354,707 A | 10/1994 | Chapple-Sokol et al. |
| 5,395,791 A | 3/1995 | Cheng et al. |
| 5,422,489 A | 6/1995 | Bhargava |
| 5,434,878 A | 7/1995 | Lawandy |
| 5,492,080 A | 2/1996 | Ohkawa et al. |
| 5,499,260 A | 3/1996 | Takahashi et al. |
| 5,505,928 A | 4/1996 | Alivisatos et al. |
| 5,515,393 A | 5/1996 | Okuyama et al. |
| 5,525,377 A | 6/1996 | Gallagher et al. |
| 5,537,000 A | 7/1996 | Alivisatos et al. |
| 5,541,948 A | 7/1996 | Krupke et al. |
| 5,585,640 A | 12/1996 | Huston et al. |
| 5,625,456 A | 4/1997 | Lawandy |
| 5,711,803 A | 1/1998 | Pehnt et al. |
| 5,747,180 A | 5/1998 | Miller et al. |
| 5,751,018 A | 5/1998 | Alivisatos et al. |
| 5,882,779 A | 3/1999 | Lawandy |

(Continued)

FOREIGN PATENT DOCUMENTS

WO    WO 95/29473    11/1995

(Continued)

OTHER PUBLICATIONS

Ekimov, A.I. et al., "Quantum Confined Atoms of Doped ZnO Nanocrystals," *Phys. Stat. Sol* (B) 229, No. 2, 897-901 (2002).

(Continued)

*Primary Examiner*—Felisa Hiteshew
(74) *Attorney, Agent, or Firm*—Steptoe & Johnson LLP

(57) ABSTRACT

A population of nanocrystals having a narrow and controllable size distribution and can be prepared by a continuous flow method.

30 Claims, 7 Drawing Sheets

U.S. PATENT DOCUMENTS

| | | | |
|---|---|---|---|
| 5,985,173 | A | 11/1999 | Gray et al. |
| 5,985,353 | A | 11/1999 | Lawton et al. |
| 5,990,479 | A | 11/1999 | Weiss et al. |
| 6,054,495 | A | 4/2000 | Markowitz et al. |
| 6,057,561 | A | 5/2000 | Kawasaki et al. |
| 6,114,038 | A | 9/2000 | Castro et al. |
| 6,179,912 | B1 | 1/2001 | Barbera-Guillem et al. |
| 6,207,229 | B1 | 3/2001 | Bawendi et al. |
| 6,224,739 | B1 | 5/2001 | Reetz et al. |
| 6,251,303 | B1 | 6/2001 | Bawendi et al. |
| 6,262,129 | B1 | 7/2001 | Murray et al. |
| 6,322,901 | B1* | 11/2001 | Bawendi et al. ............ 428/548 |
| 6,326,144 | B1 | 12/2001 | Bawendi et al. |
| 6,379,635 | B2 | 4/2002 | O'Brien et al. |
| 6,447,698 | B1 | 9/2002 | Ihara et al. |
| 6,576,291 | B2* | 6/2003 | Bawendi et al. ............ 427/215 |
| 6,617,583 | B1 | 9/2003 | Bawendi et al. |
| 6,633,370 | B2 | 10/2003 | Lawandy |
| 6,682,596 | B2 | 1/2004 | Zehnder et al. |
| 6,794,265 | B2 | 9/2004 | Lee et al. |
| 6,821,337 | B2* | 11/2004 | Bawendi et al. ............... 117/3 |
| 2002/0066401 | A1 | 6/2002 | Peng et al. |
| 2002/0071952 | A1 | 6/2002 | Bawendi et al. |
| 2002/0144644 | A1 | 10/2002 | Zehnder et al. |
| 2003/0017264 | A1 | 1/2003 | Treadway et al. |
| 2004/0091710 | A1 | 5/2004 | Bawendi et al. |
| 2004/0110002 | A1 | 6/2004 | Kim et al. |

FOREIGN PATENT DOCUMENTS

| | | |
|---|---|---|
| WO | WO 98/04740 | 2/1998 |
| WO | WO98/19963 | 5/1998 |
| WO | WO 98/19963 | 5/1998 |
| WO | WO 98/33070 | 7/1998 |
| WO | WO 98/36376 | 8/1998 |
| WO | WO 98/46372 | 10/1998 |
| WO | WO99/26299 | 5/1999 |
| WO | WO00/17103 | 3/2000 |
| WO | WO00/17642 | 3/2000 |
| WO | WO00/17655 | 3/2000 |
| WO | WO00/17656 | 3/2000 |
| WO | WO01/07689 | 2/2001 |

OTHER PUBLICATIONS

Ekimov, A.I. et al., "Spin-flip and acoustic-phonon Raman scattering in CdS nanocrsytals," *Physcial Review B*, vol. 58, No. 4, 15 (Jul. 1998-II), 2077-2087.

Ekimov, A.I. et al., "CdS nanocrystal growth in thin silica films: evolution of size distribution function," *Journal of Crystal Growth* 184/185 (1998) 360-364.

Ekimov, A.I. et al., "Dynamics of excitons in CuBr nanocrystals: Spectral-hole burning and transient four-wave-mixing measurements," *Physical Review B*, vol. 57, No. 3, Jan. 15, 1998-I, 1774-1783.

Ekimov, A.I. et al., "Size-selective resonant Raman scattering in CdS doped glasses," *Physical Review B*, vol. 57, No. 1, Jan. 1, 1998-I, 341-346.

Ekimov, A.I. et al., "Growth and optical properties of semiconductor nanocrystals in a glass matrix," *Journal of Luminescence* 70 (1996) 1-20.

Ekimov, A.I. et al., "Size dependence of acoustic and optical vibrational modes of CdSe nanocrystals in glasses," *Journal of Non-Crystalline Solids* 197 (1996) 238-246.

Ekimov, A.I. et al., "Subpicosecond dynamics of confined excitons in CuCl nanocrystals," *Materials Science and Engineering* A217/218 (1996) 167-170.

Ekimov, A.I. et al., "Enhancement of electron-hole exchange interaction in CdSe nanocrystals; A quantum confinement effect," *Physical Review B*, vol. 53, No. 3, Jan. 15, 1996-I, 1336-1342.

Ekimov, A.I. et al., "Subpicosecond dynamics of confined excitons and optical nonlinearities of CuCl quantum dots," *Journal of Luminescence* 66 & 67 (1996) 406-409.

Ekimov, A.I. et al., "Size-dependent Electron-Hole Exchange Interaction in CdSe Quantum Dots, *Il Nuovo Cimento*," vol. 17, Nos. 11-12, (1995) 1407-1412.

Ekimov, A.I. et al., "Polaron and Exciton-Phonon Complexes in CuCl Nanocrystals," *Physical Review Letters*, vol. 74, No. 9, Feb. 27, 1995, p. 1645.

Ekimov, A.I. et al., "Growth of CdSe nanocrystals in ion-implanted $SiO_2$ films," *Journal of Crystal Growth* 151 (1995) 38-45.

Ekimov, A.I. et al., "Effects of Resonance on Low-Frequency Raman Scattering From Semiconductor Nanocrystals," *Radiation Effects and Defects in Solids*, 1995, vol. 137, pp. 45-50.

Ekimov, A.I. et al., "Optical Properties of Oxide Glasses Doped by Semiconductor Nanocrystals," *Radiation Effects and Defects in Solids*, 1995, vol. 134, pp. 11-22.

Ekimov, A.I. et al., "Enhancement of Exciton Exchange Interaction Quantum Confinement in CdSe Nanocrystals," *Jpn. J. Appl. Phys*, vol. 34, 12-14 (1994).

Ekimov, A.I. et al., "Growth of CdS nanocrystals in silicate glasses and in thin $SiO_2$ films in the Initial states of the phase separation of a solid solution," *Semiconductors*, 28 (5), May 1994, 486-493.

Ekimov, A.I. et al., "Interference effects on the properties of confined excitons in CuCl microcrystals," *Journal of Luminescence* 60 & 61 (1994) 396-399.

Ekimov, A. I., "Surface Recombination of Nonequilibrium Electron-Hole Plasma in Laser-Modified Semiconductor-Doped Glasses," *Solid State Communications*, vol. 87, No. 6, 577-580 (1993).

Ekimov, A I. "Dynamics of Nonlinear Optical Response of CuBr-Doped Glasses," *Superlattices and Microstructures*, vol. 3, No. 2, 199-202 (1993).

Ekimov, A. I., "Absorption and intensity-dependent photoluminescence measurements on CdSe quantum dots: assignment of the first electronic transitions," *Journal of the Optical Society of America*, vol. 10, Nos. 1-12, 100-107 (1992).

Ekimov, A.I. et al. "Preparation and investigation of $SiO_2$ films activated by CdS semiconductor nanocrystals," *Soviet Physics Semiconductors*, vol. 26, 57-59 (1992).

Ekimov, A.I. et al. "Generation of reflected second harmonic at semiconductor quantum dots," *JETP Letters*, vol. 55, No. 8, 435-439 (1992).

Ekimov, A.I. et al. "Dimensional Effects in Luminescence Spectra of Zero-Dimensional Semiconductor Structures," *Bulletin of the Russian Academy of Sciences*, vol. 56, No. 2, pp. 154-157, Feb. 1992.

Ekimov, A.I. et al., "Fast switching of the transmission of light by glasses activated with CdS microcrystals," *Sov. Phys. Semicond.*, vol. 25 No. 2, 164-166 (1991).

Ekimov, A.I. et al., "Resonance Raman Spectroscopy of Electron-Hole Pairs—Polar Phonon Coupling in Semiconductor Quantum Microcrystals," *Solid State Communications*, vol. 78, No. 10, pp. 853-856, 1991.

Ekimov, A.I. et al., "Optics of Zero Dimensional Semiconductor Systems, *Acta Physica Polonica A*," vol. 79 (1991), No. 1. pp. 5-14.

Ekimov, A.I. et al., "Optical Properties of Semiconductor Quantum Dots in Glass Matrix," *Physica Scripta*. vol. T39, 217-222 (1991).

Ekimov, A.I. et al. "Rapid Processes of Darkening and Bleaching in CdS Doped Glasses," *Superlattices and Microstructures* vol. 10, No. 3, 307-310 (1990).

Ekimov, A.I. et al., "Auger ionization of semiconductor quantum drops in a glass matrix," *Journal of Luminescence* 47 (1990) 113-127 North-Holland.

Ekimov, A.I. et al., "Time-Resolved Luminescence of CdSe Microcrystals," *Solid State Communications*, vol. 74, No. 7, pp. 555-557, 1990.

Ekimov, A.I. et al., "Quantum-Size Stark Effect in Semiconductor Microcrytals," *Journal of Luminescence* 46 (1990) 97-100 North-Holland.

Ekimov, A.I. et al., "Spectra and Decay Kinetics of Radiative Recombination in CdS Microcrystals," *Journal of Luminescence* 46 (1990) 83-95 North-Holland.

Ekimov, A.I. et al., "Influence of high hydrostatic pressures on the exciton spectrum of CdS microcrystals in glass," *Sov. Phys. Semicond.* 23(9), Sep. 1989, pp. 965-966.

Ekimov, A.I. et al., "Photoluminescence of quasizero-dimensional semiconductor structures," *Sov. Phys. Solid State* 31(8), Aug. 1989, pp. 1385-1393.

Ekimov, A.I. et al., "Photoionization of Semiconducting microcrystals in glass," *Sov. Phys. Solid State* 31(1), Jan. 1989, pp. 149-151.

Ekimov, A.I. et al., "Donor-like Exciton in Zero-Dimension Semiconductor Structures," *Solid State Communications*, vol. 69, No. 5, pp. 565-568, 1989.

Ekimov, A.I. et al., "Nonlinear Optics of Semiconductor-Doped Glasses," *Phys. Stat. Sol.* (b), (1988) pp. 627-633.

Ekimov, A.I. et al., "Nonlinear optical properties of semiconductor microcrystals," *JETP Lett.*, vol. 46, No. 10, Nov. 25, 1987 pp. 435-439.

Ekimov, A.I. et al., "Quantization of the energy spectrum of holes in the adiabatic potential of the electron," *JETP Lett.*, vol. 43, No. 6, Mar. 25, 1986, pp. 376-379.

Ekimov, A.I. et al., "Quantum Size Effect in Semiconductor Microcrystals," *Solid State Communications*, vol. 56, No. 11, pp. 921-924, 1985.

Ekimov, A.I. et al., "Size quantization of the electron energy spectrum in a microscopic semiconductor crystal," *JETP Lett.*, vol. 40, No. 8, Oct. 25, 1984, pp. 1136-1139.

Ekimov, A.I. et al., "Quantum size effect in the optical spectra of semiconductor microcrystals," *Sov. Phys. Semicond.* 16(7), Jul. 1982, pp. 775-778.

Ekimov, A.I. et al., "Quantum size effect in three-dimensional microscopic semiconductor crystals," *JETP Lett*, vol. 34, No. 6, Sep. 20, 1981, pp. 345-349.

Ekimov, A.I. et al., "Oscillations of polarization of recombination radiation of a variable gap semiconductor in a magnetic field," *JETP Lett.*, vol. 25 No. 55, 526-528 (1977).

Alivisatos et al., "Organization of 'nanocrystal molecules' using DNA" Nature 1996, 382, 609-611.

Alivisatos et al., "Semiconductor Clusters, Nanocrystals, and Quantum Dots," *Science*, 271:933-937, Feb. 16, 1996.

Alivisatos, A.P. "Perspectives on the Physical Chemistry of Semiconductor Nanocrystals", *J. Phys. Chem.*, 100:13226 (Aug. 1996).

Bailey, R.E. et al. "Alloyed Semiconductor Quantum Dots: Tuning the Optical Properties without changing the Particle Size" J. Am. Chem. Soc. 2003, 125, 7100-7106.

Battaglia et al., "Formation of High Quality InP and InAs Nanocrystals in a Noncoordinating Solvent" Nano Letters 2002, 2, 1027-1030.

Bawendi et al., "Luminescence properties of CdSe quantum crystallites: resonance between interior and surface localized states," *J. Chem. Phys.*, 96(2):946-954, 1992.

Bawendi, M. G. et al., "Electronic Structures and Photoexcited-Carrier Dynamics in Nanometer-Size CdSe Clusters." Physical Review Letters, vol. 65, No. 11, pp. 1623-1626, (1990).

Bawendi, M. G. et al., "X-ray structural characterization of larger CdSe semiconductor clusters," J. Chem. Phys., vol. 91, No. 11, pp. 7282-7290, (1989).

Beverloo et al., "Preparation and Microscopic Visualization of Multicolor Luminescent Immunophosphors," *Cytometry*, 13:561-570, 1992.

Bruchez, Jr. et al., *Science* 1998, 281, 2013-2016.

Bunge, S.D. et al. "Growth and morphology of cadmium chalcogenides: the synthesis of nanorods, tetrapods, and spheres from CdO and $Cd(O_2CCH_3)_2$," J. Mater. Chem. 2003, 13, 1705-1709.

Chan et al. "Quantum Dot Bioconjugates for Ultrasensitive Nonisotopic Detection" *Science* 1998, 281, 2016-2018.

Chan et al., Nano Letters 2003, 3, 199-201.

Chan, F. et al. "Synthesis and properties of Lead Selenide Nanocrystal Solids" Mat. Res. Soc. Symp. Proc. 691, 2002, 359-364.

Coe et al., *Nature* 2002, 420, 800-803.

Colvin et al., "Light-emitting diodes made from cadmium selenide nanocrystals and a semiconducting polymer" *Nature*, 370(6488):354-357, Aug. 4, 1994.

Correa-Duarte M. A. et al., "Stabilization of CdS semiconductor nanoparticles against photodegradation by a silica coating procedure," Chemical Physics Letters 286:497-501 (1998).

Cumberland, S.L. et al. "Inorganic Clusters as Single Source Precursors for Preparation of CdSe, ZnSe, and CdSe/ZnS Nanomaterials" Chem. Mater. 2002, 14, 1576-1584.

Dabbousi B.O. et al., "(CdSe)ZnS Core-Shell Quantum Dots: Synthesis and Characterization of a Size Series of Highly Luminescent Nanocrystallites," The Journal of Physical Chemistry B, 101(46):9463-9475 (1997).

Dabbousi B.O. et al., "Electroluminescence from CdSe quantum-dot/polymer composites," Appl. Phys. Lett. 66 (11):1316-1318 (1995).

Danek et al., "Synthesis of Luminescent Thin-Film CdSe/ZnSe Quantum Dot Composites Using CdSe Quantum Dots Passivated with an Overlayer of ZnSe" Chem. Mater., 8(1):173-180, 1996.

Edel et al., Chem. Comm. 2002, 1136-1137.

Eisler et al., *Appl. Phys. Lett.* 2002, 80, 4614-4616.

Empedocles et al., "Photoluminscense Spectroscopy of Single CdSe Nanocrsytallite Quantum Dots", *Phys. Rev. Lett.*, 77(18):3873 (Oct. 1996).

Gan et al., "Enhanced Photoluminescence and Characterization of Mn-Doped ZnS Nanocrystallites Synthesized in Microemulsion," *Langmuir*, 1997 (13):6427-6431, 1997.

Gao M. et al., "Strongly Photoluminenscent CdTe Nanocrystals by Proper Surface Modification," J. Phys. Chem. B 102:8360-8363 (1998).

Gaponik, N. "Thiol-Capping of the CdTe Nanocrystals: An Alternative to Organometallic Synthetic Routes" J. Phys. Chem. B 2002, 106, 7177-7185.

Green M. et al., "Recent advances in the preparation of semiconductors as isolated nanometric particles: new routes to quantum dots," Chem. Commun., 2235-2241 (1999).

Guha et al., "Hybrid organic-inorganic semiconductor-based light-emitting diodes" *J. Appl. Phys.*, 82(8):4126-4128, Oct. 15, 1997.

Guzelian, A.A. et al. "Colloidal chemical synthesis and characterization of InAs nanocrystal quantum dots" Appl. Phys. Lett. 1996, 69, 1432-1434.

Harrison, M.T. et al. "Wet chemical synthesis and spectroscopic study of CdHgTe nanocrystals with strong near-infrared luminescence" Mat. Sci. Eng. B, 2000, 69-70, 355-360.

Hines M.A. et al., "Synthesis and Characterization of Strongly Luminescing ZnS-Capped CdSe Nanocrystals," J. Phys. Chem. 100:468-471 (1996).

J.-K. Lee et al., "Surface Derivatization of Nanocrystalline CdSe Semiconductors," Mat. Res. Soc. Symp. Proc. 452:323-328 (1997).

Jarvis et al., "Solution Synthesis and Photoluminescence Studies of Small Crystallites of Cadmium Telluride," *Mat. Res. Soc. Symp. Proc.*, 272:229-234, 1992.

Jarvis, R.F. Jr. et al., "Solution Synthesis and Photoluminescence Studies of SMA Crystallites of Cadmium Telluride," Mat. Res. Soc. Symp. Proc. 272:227-234 (1992).

Kagan et al., "Electronic Energy Transfer in CdSe Quantum Dot Solids," *Physical Review Letters*, 76:1517-1520, Feb. 26, 1997.

Kagan et al., "Long-Range Resonance Transfer of Electronic Excitations in Close-Packed CdSe Quantum-Dot Solids," *Physical Review Letters*, 54:8633-8643, Sep. 15, 1996.

Kazes et al., Adv. Mater. 2002, 14, 317-321.

Kortan et al., "Nucleation and Growth of CdSe on ZnS Quantum Crystallite Seeds, and Vice Versa, in Inverse Micella Media", *J. Am. Chem. Soc.*, 112:1327 (1990).

Kuno et al., "The band edge luminescence of surface modified CdSe nanocrsytallites: Probing the luminescing state," *J. Chem. Phys.*, 106(23):9869-9882, Jun. 1997.

Klimov et al., *Science* 2000, 290, 314-317.

Lawless et al., "Bifunctional Capping of CdS Nanoparticles and Bridging to $TiO_2$," *J. Phys. Chem.*, 99:10329-10325, 1995.

Leatherdale et al., *J. Phys. Chem. B* 2002, 106, 7619-7622.

Lee et al., "Surface Derivatization of Nanocrystalline CdSe Semiconductors," *Mat. Res. Soc. Symp. Proc.*, 452:323-328, Mar. 13, 1997.

Leppert, Valerie J. et al., "Structural and optical characteristics of ZnSe nanocrystals synthesized in the presence of a polymer capping agent", Materials Science and Engineering B52, pp. 89-92, (1998).

Liz-Marzan et al., "Synthesis of Nanosized Gold-Silica Core-Shell Particles" *Langmuir*, 12:4329-4335, 1996.

Ludolph B. et al., "Novel single molecule precursor routes for the direct synthesis of highly monodispersed quantum dots of cadmium or zinc sulfide or selenide," Chem. Commun. 1849-1850 (1998).

Malik M. A. et al., "Semiconductor nanoparticles: their properties, synthesis and potential for application," So. African Journal of Science 26:55-60 (2000).

Malko et al., Appl. Phys. Lett. 2002, 81, 1303-1305.

Matsumoto et al., "Preparation of Monodisperse CdS Nanocrystals by Size Selective Photocorrosion", *J. Phys. Chem.*, 100(32):13782 (Aug. 1996).

Mattoussi et al., *J. Am. Chem. Soc.* 2000, 122, 12142-12150.

Mattoussi et al., Phys. Rev. B 1998, 58, 7850-7863.

Mikulec et al., "Synthesis and Characterization of Highly Luminescent (CdSe)ZnS Quantum Dots," *Materials Research Society Symposium*, 359-364, Boston, MA, Dec. 2-6, 1997.

Mikulec, F.V. "Synthesis and Characterization of Highly Luminescent (CdSe)ZnS Quantum Dots," Mat. Res. Soc. Symp. Proc. 452:359-364 (1997).

Mokari et al. "Synthesis and Properties of CdSe/ZnS Core/Shell Nanorods" Chem. Mater. 2003, 15(20); 3955-3960.

Müllenborn et al., "Characterization of Solution-Synthesized CdTe and HgTe," *Applied Physics*, 56:317-321, 1993.

Murray et al., "Synthesis and Characterization of Nearly Monodisperse CdE (E=S, Se, Te) Semiconductor Nanocrystallites", *J. Am. Chem. Soc.*, 115:8706 (1993).

Murray et al., *IBM J. Res. & Dev.* 2001, 45, 47-56.

Nakamura et al., Chem. Comm. 2002, 2844-2845.

Nirmal et al., "Fluorescence Intermittency in single Cadmium Selenide Nanocrystals", *Nature*, 383:802 (Oct. 1996).

Nozik, A. J. et al., "Colloidal Quantum Dots of III-V Semiconductors," MRS Bulletin, 23(2):24-30 (1998).

Pehnt et al., "Nanoparticle Precursor Route to Low-Temperature Spray Deposition of CdTe Thin Films," *Appl. Phys. Lett.*, 67(15):2176-2178, 1995.

Peng X. et al., "Epitaxial Growth of Highly Luminescent CdSe/CdS Core/Shell Nanocrystals with Photostability and Electronic Accessibility," J. Am. Chem. Soc. 119: 7019-7029 (1997).

Peng X. et al., "Synthesis and Isolation of a Homodimer of Cadmium Selenide Nanocrystals," Angew. Chem. Ind. Ed. Engl. 36:145-147 (1997).

Peng et al., *J. Am. Chem. Soc.* 1998, 120, 5343-5344.

Peng et al., *J. Am. Chem. Soc.* 2001, 123, 183-184.

Qu et al., Nano Lett. 2001, 1, 333-337.

Rajh, et al., "Synthesis and Characterization of Surface-Modified Colloidal CdTe Quantum Dots," *J. Phys. Chem.*, 97:11999-12003, Nov. 1993.

Resch, U. et al. "Photochemistry and Radiation Chemistry of Colloidal Semiconductors. 33. Chemical Changes and Fluorescence in CdTe and ZnTe" Langmuir 1989, 5, 1015-1020.

Ridley, et al., "All-Inorganic Field Effect Transistors Fabricated by Printing", Science, vol. 286, No. 5440, pp. 746-749, Oct. 22, 1999.

Rogach et al., "Synthesis and characterization of Thiol-Stabilized CdTe Nanocrystals" *Ber. Bunsenges. Phys. Chem.*, 100(11):1772-2778, 1996.

Rogach et al., "Colloidally Prepared HgTe Nanocrystals with Strong Room-Temperature Infrared Luminescence" Adv. Mater. 1999, 11, 552-554.

Rogach et al. "Synehesis, Morphology, and Optical Properties of Thiol-Stabilized CdTe Nanoclusters in Aqueous Solution" Ber. Bunsenges. Phys. Chem. 1997, 101, 1668-1670.

Schlamp et al., *J. Appl. Phys.* 1997, 82, 5837-5842.

Spanhel L. et al., "Photochemistry of Colloidal Semiconductors. 20. Surface Modification and Stability of Strong Luminescing CdS Particles," J. Am. Chem. Soc. 109:5649-5655 (1987).

Steigerwald et al., "Surface Derivatization and Isolation of Semiconductor Cluster Molecules," *J. Am. Chem. Soc.*, 110:3046-3050, 1988.

Sugimoto, Adv. Coll. Int. Sci. 1987, 28, 65-108.

Sundar et al., Adv. Mater. 2002, 14, 739-743.

Suzuki, K. et al. "Structural and optical properties of type II GaSb/GaAs self-assembled quantum dots grown by molecular beam epitaxy" J. Appl. Phys. 1999, 85, 8349-8352.

Talapin et al., *J. Phys Chem. B* 2001, 105, 12278-12285.

Tessler et al., Science 2002, 295, 1506-1508.

Yang, C.-S. et al. "Growth of CdS Nanorods in Nonionic Amphiphilic Triblock Copolymer Systems" Chem. Mater. 2002, 14, 1277-1284.

\* cited by examiner

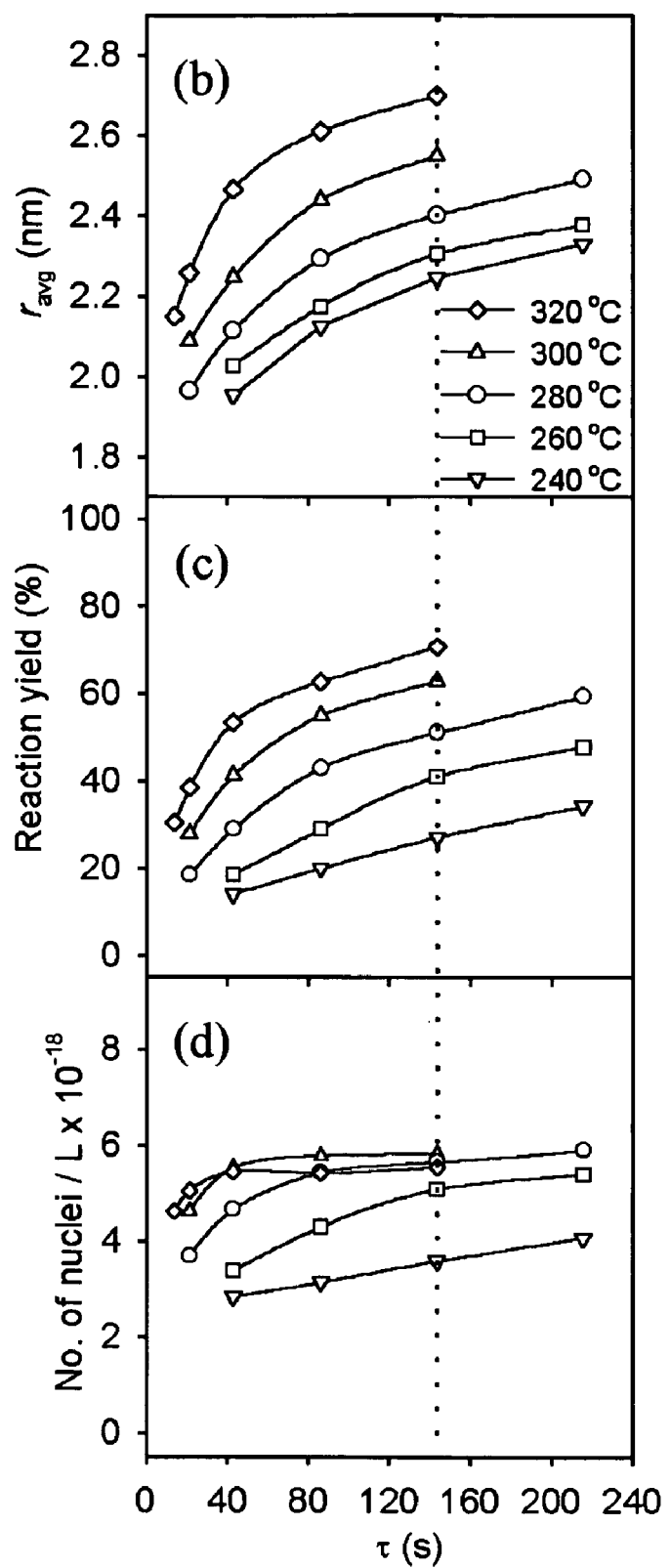
FIGS. 1B-D

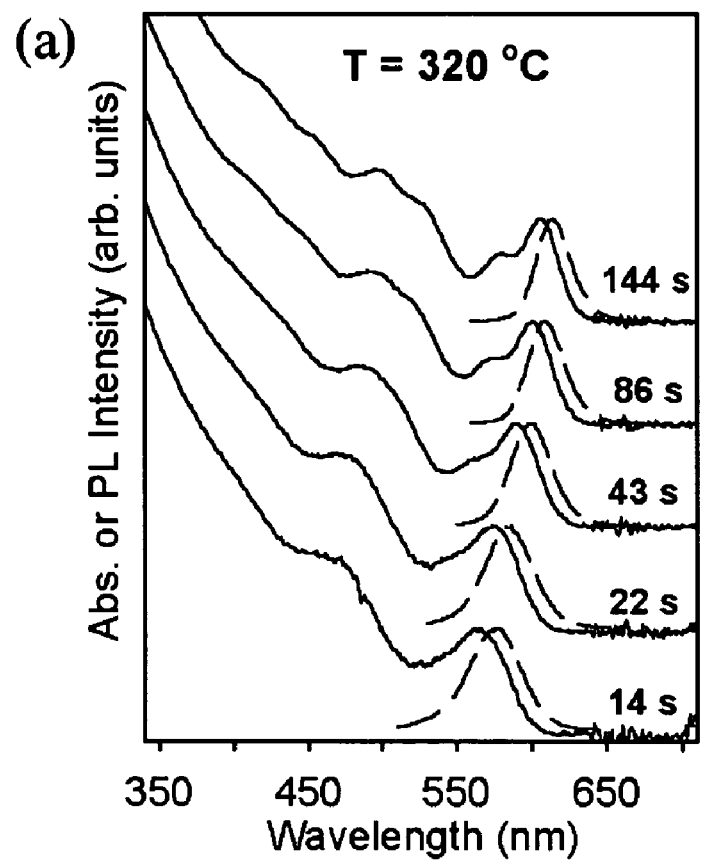
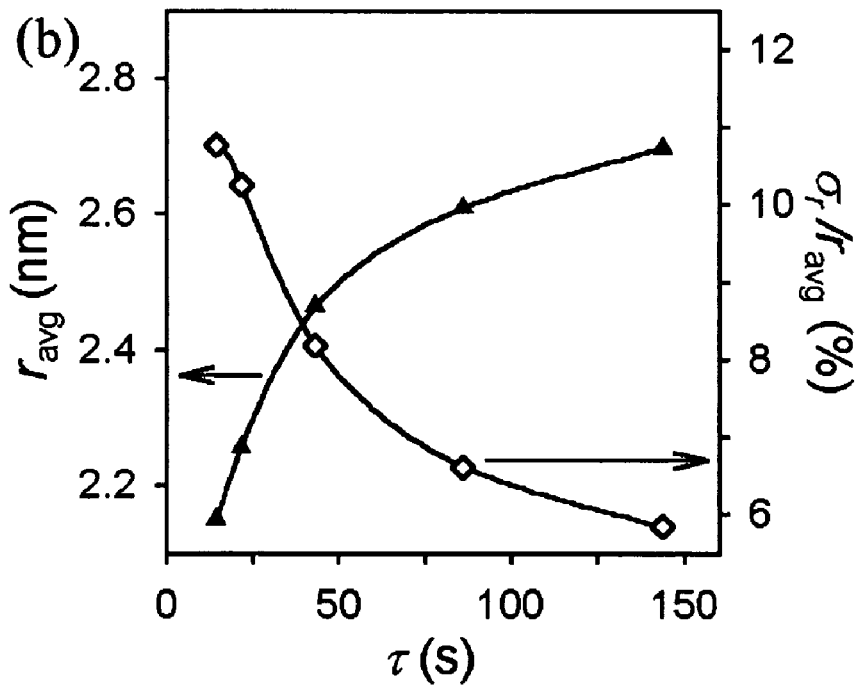
FIGS. 2A-B

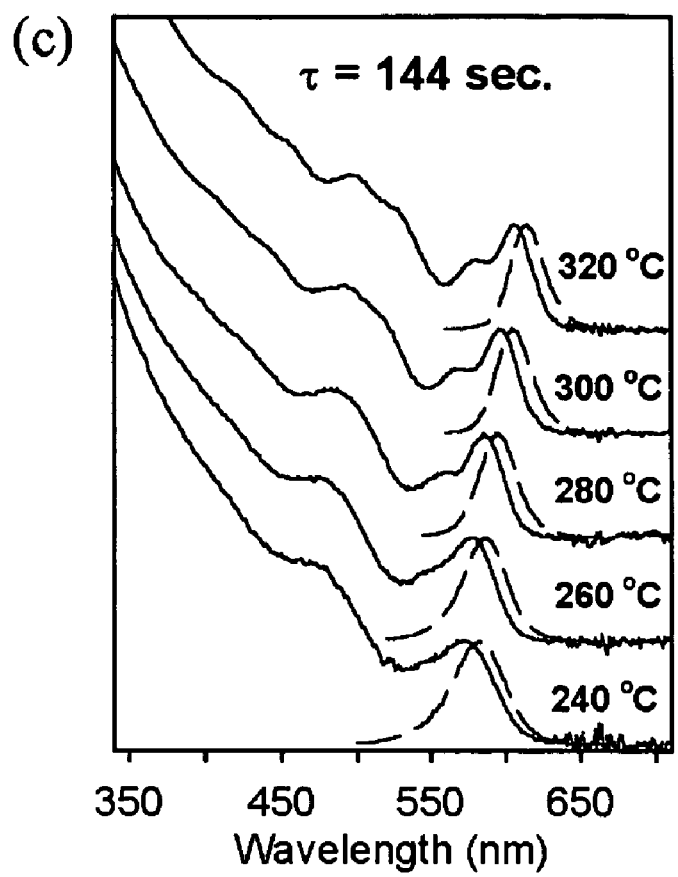
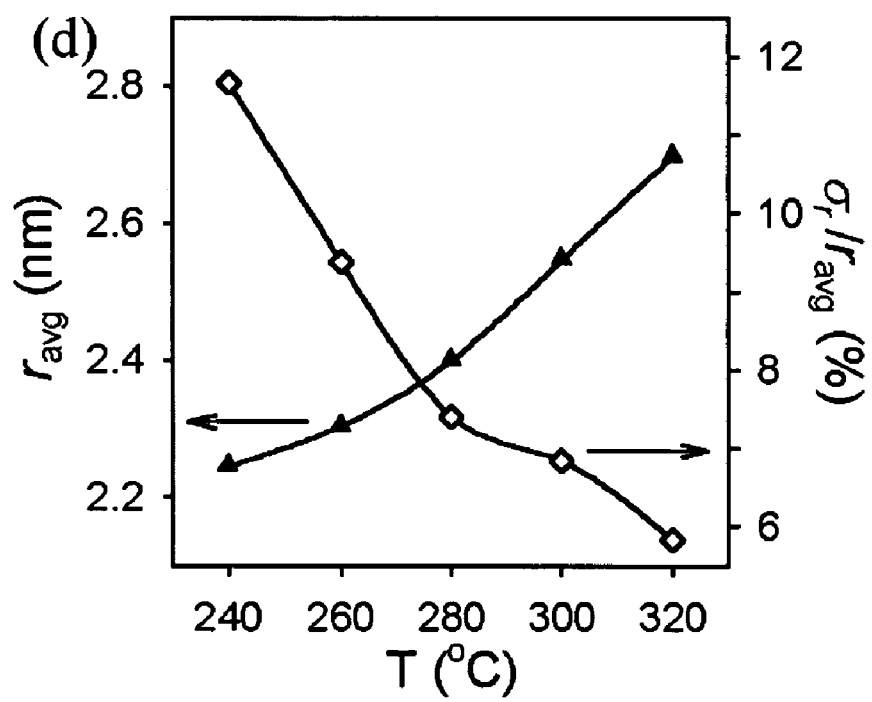
FIGS. 2C-D

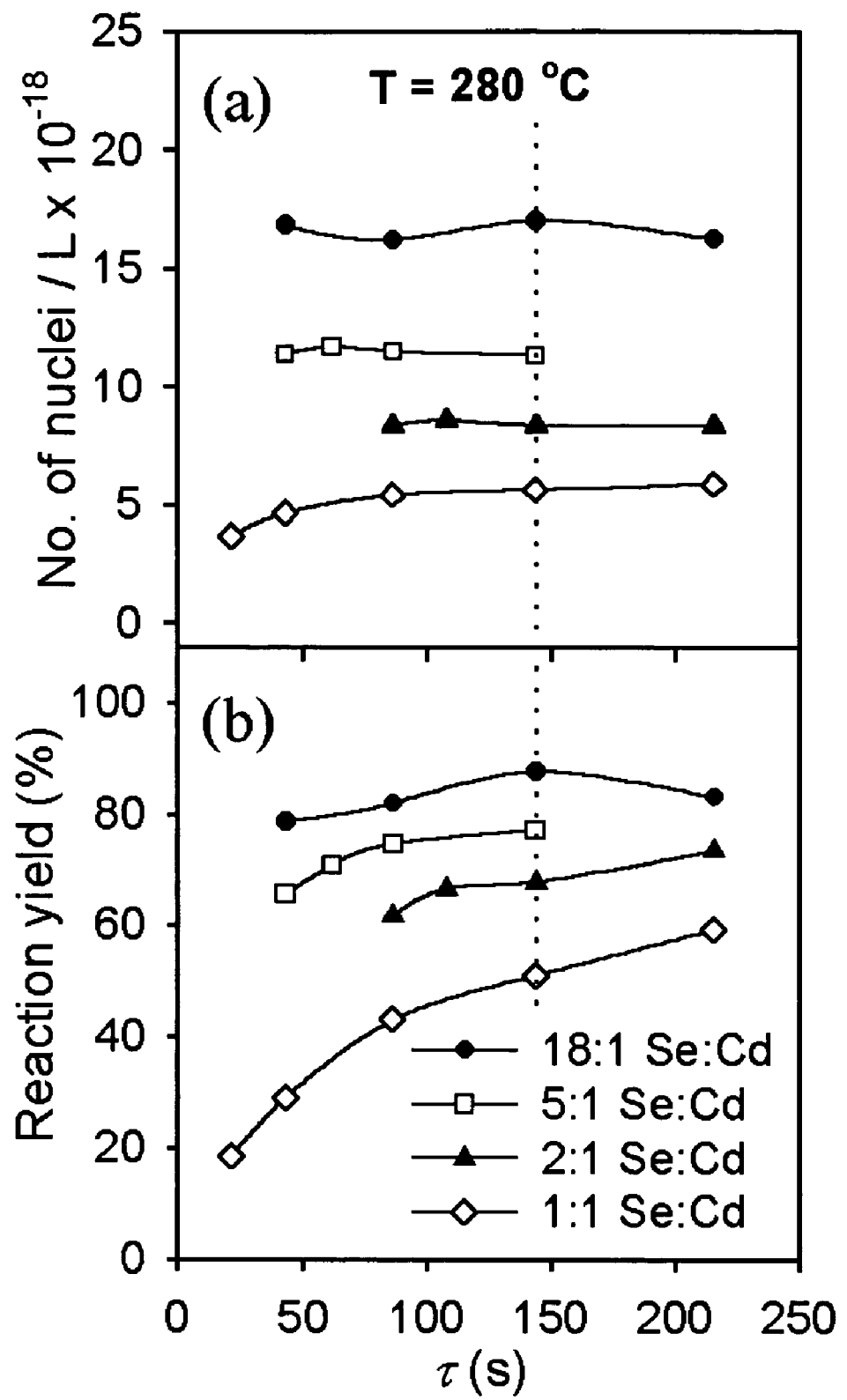
FIGS. 3A-B

METHOD OF PREPARING NANOCRYSTALS

This application claims priority to U.S. Application No. 60/497,706, filed Aug. 26, 2003, which is incorporated by reference in its entirety.

FEDERALLY SPONSORED RESEARCH OR DEVELOPMENT

This invention was made with government support under Contract No. DMR-0213282 and CHE-0209898 from the National Science Foundation. The government may have certain rights in the invention.

TECHNICAL FIELD

The invention relates to methods of preparing nanocrystals.

BACKGROUND

Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Typically, the nanocrystals are prepared in a batch process.

SUMMARY

A continuous method of manufacturing a nanocrystal can produce high quality nanocrystals. In one aspect, a method of manufacturing a population of nanocrystals includes combining an M-source and an X donor in a fluid in a mixing region to form a mixture, transporting the mixture through a reaction zone, the mixture being heated in the reaction zone to a temperature for a time sufficient to grow a nanocrystal, and transporting the mixture from the reaction zone to a growth stopping zone to form the population of nanocrystals. The continuous method can be, for example, can include constant flow or segmented flow processes.

In another aspect, a method of manufacturing a population of nanocrystals includes heating a mixture of an M-source and an X donor in a fluid in a reaction zone to a growth temperature for a preselected amount of time, for example, less than fifteen minutes or less than five minutes, and cooling the mixture below the growth temperature to stop growth of the nanocrystals.

In another aspect, a continuous flow reactor for producing a population of nanocrystal includes a mixer, a reaction conduit fluidly connected to the mixer and having a reaction zone, the reaction zone being heated to a constant temperature, an M source reservoir fluidly connected to the mixer, and an X source reservoir fluidly connected to the mixer. The mixer can be a convective mixing chamber. The reaction conduit can be a heated glass reaction channel. The reaction zone can include a temperature controller that maintains the reaction zone at the constant temperature, the constant temperature being between 180 and 320° C. The reactor can include a growth stopping zone fluidly connected to the reaction zone. The reaction conduit can be configured for segmented flow, for example, by having a port for controlled gas introduction into the conduit, or having dimension changes that change flow rates in a periodic manner.

The method can include selecting a ratio of the M-source and the X donor to grow the population of nanocrystals to have a predetermined average size, selecting the temperature of reaction zone to grow the population of nanocrystals to have a predetermined average size or selecting a ratio of the M-source and the X donor and the temperature of reaction zone to grow the population of nanocrystals to have a predetermined average size. In certain embodiments, the method can include cooling the mixture in the growth stopping zone or forming an overcoating of a semiconductor material on a surface of a nanocrystal in the population, or combinations thereof. Transporting the mixture can include flowing or segmented flowing of the mixture through a conduit. The method can also include introducing a gas phase into the mixture during transport. The temperature can be greater than 150° C. The temperature can be less than 350° C. The time can be less than 30 minutes, less than 20 minute, less than 15 minutes, less than 10 minutes, or less than 5 minutes.

The M-source can be an M-containing salt, such as a halide, carboxylate, carbonate, hydroxide, or diketonate, in which M can be Cd, Zn, Mg, Hg, Al, Ga, In, or Tl. X can be O, S, Se, Te, N, P, As, or Sb. The mixture can include an amine, such as a primary amine (e.g., a $C_8$–$C_{20}$ alkyl amine). The X donor can include a phosphine chalcogenide, a bis(silyl) chalcogenide, dioxygen, an ammonium salt, or a tris(silyl) pnictide.

The M-source and the X donor can be combined by contacting a metal, M, or an M-containing salt, and a reducing agent to form an M-containing precursor. The reducing agent can include an alkyl phosphine, a 1,2-diol or an aldehyde, such as a $C_6$–$C_{20}$ alkyl diol or a $C_6$–$C_{20}$ aldehyde.

A nanocrystal in the population can photoluminesce with a quantum efficiency of at least 10%. The population of nanocrystals can have an average particle size in the range of about 20 Å to about 125 Å. The fluid can include a coordinating solvent. The population of nanocrystals can be monodisperse. The population can emit light in a spectral range of no greater than about 75 nm full width at half max (FWHM). The population can exhibit less than a 15% rms deviation in diameter of the nanocrystal.

The M-source can be an M-containing salt. The M-containing salt can be a safe, inexpensive starting material for manufacturing a nanocrystal relative to typical organometallic reagents which can be air sensitive, pyrophoric, or volatile. The M-containing salt is not air sensitive, is not pyrophoric, and is not volatile relative to organometallic reagents.

A flow reactor can be used to prepare a size series of colloidal semiconductor nanocrystals by a continuous flow method. The continuous flow method produces samples with size distributions and quantum efficiencies comparable to those prepared in conventional batch processes. The results obtained from a microcapillary flow reactor can provide insight into the kinetics of nucleation and growth for nanocrystal systems.

The details of one or more embodiments are set forth in the description below. Other features, objects, and advantages will be apparent from the description and from the claims.

BRIEF DESCRIPTION OF DRAWINGS

FIGS. 1B–D are graphs depicting results of reactions to prepare nanocrystals under different conditions.

FIGS. 2A and C are graphs depicting absorbance and photoluminescence spectra for nanocrystal samples produced under various conditions.

FIGS. 2B and D are graphs depicting average nanocrystal size and size distribution ($\square_r$) of the nanocrystal samples shown in FIGS. 2A and 2C, respectively.

FIG. 3A is a graph depicting the dependence of the number of nuclei on the concentration of TOPSe for a reactor temperature of 280° C.

FIG. 3B is a graph depicting the reaction yields for the reaction conditions in FIG. 3A.

DETAILED DESCRIPTION

Figure 1A:
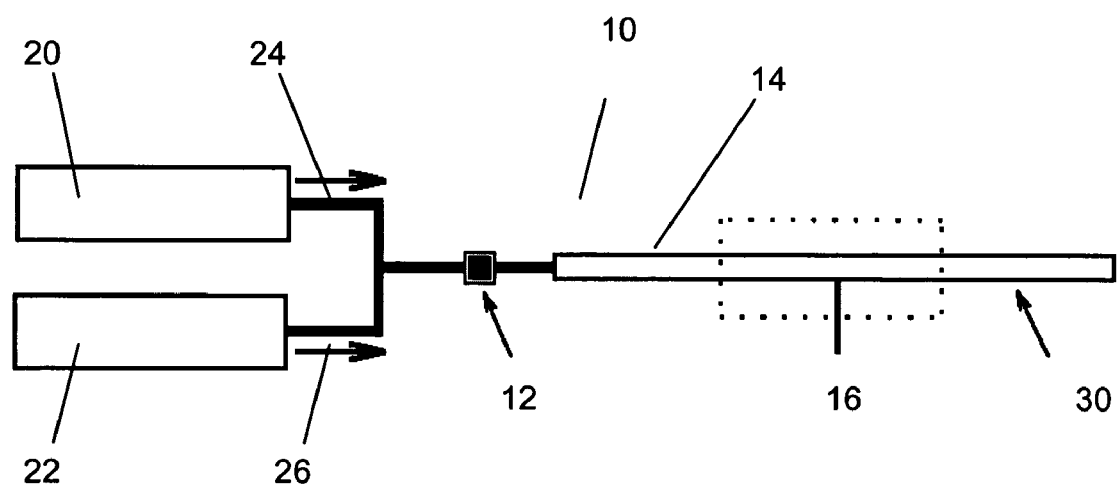
FIG. 1A is a schematic drawing depicting a capillary reactor.

Colloidal semiconductor nanocrystals have been extensively studied in recent years for use in a variety of applications including biological fluorescent labels, electroluminescent devices, and lasers. See, for example, Bruchez, Jr. et al., *Science* 1998, 281, 2013–2016, Chan et al. *Science* 1998, 281, 2016–2018, Mattoussi et al., *J. Am. Chem. Soc.* 2000, 122, 12142–12150, Colvin et al., *Nature* 1994, 370, 354–357, Dabbousi et al., *Appl. Phys. Lett.* 1995, 66, 1316–1318, Schlamp et al., *J. Appl. Phys.* 1997, 82, 5837–5842, Tessler et al., *Science* 2002, 295, 1506–1508, Coe et al., *Nature* 2002, 420, 800–803, Klimov et al., *Science* 2000, 290, 314–317, Kazes et al., *Adv. Mater.* 2002, 14, 317–321, Sundar et al., *Adv. Mater.* 2002, 14, 739–743, Eisler et al., *Appl. Phys. Lett.* 2002, 80, 4614–4616, Malko et al., *Appl. Phys. Lett.* 2002, 81, 1303–1305, each of which has been incorporated by reference in its entirety. For any of these applications, it is essential to begin with high quality nanocrystals, and advances in the synthesis of II-VI and III-V nanocrystals have made it possible to prepare relatively monodisperse, highly crystalline samples. In preparations with organometallic precursors, nanocrystals are often prepared in a batch process in which the precursors are rapidly injected into a heated flask containing a mixture of solvents and coordinating ligands. See, for example, Murray et al., *J. Am. Chem. Soc.* 1993, 115, 8706–8715, Murray et al., *J. Res. & Dev.* 2001, 45, 47–56, Qu et al., *Nano Lett.* 2001, 1, 333–337, Peng et al., *J. Am. Chem. Soc.* 2001, 123, 183–184, Bawendi et al., US Patent Application 20020071952, Peng et al., *J. Am. Chem. Soc.* 1998, 120, 5343–5344, each of which is incorporated by reference in its entirety. The quality and average size of nanocrystals synthesized in the batch process can depend strongly on factors which are difficult to control such as features of the injection process, local temperature and concentration fluctuations, rate of stirring, and rate of cooling, among others.

In a continuous flow system, reactions are performed at steady state, making it possible to achieve better control and reproducibility. Further benefits can be realized by scaling down the reactor dimensions to micrometers, thereby reducing the consumption of reagents during the optimization process and improving the uniformity of temperature and residence times within the reaction volume. A microfluidic flow reactor is attractive for nanocrystal synthesis because it is possible to rapidly and continuously screen through important reaction parameters, while using minimal amounts of reagents, until nanocrystals of the desired size and monodispersity are produced. In contrast, each set of parameters would represent a separate reaction if the optimization procedure were conducted using a batch process. One of the inherent advantages of a microfluidic flow system also make it a natural choice for extracting kinetic data on nanocrystal nucleation and growth processes, information which has been difficult to obtain using conventional, macroscale batch methods. Once the reaction details are understood at the microfluidic level, the continuous flow system can be readily scaled up for production.

In spite of the perceived advantages of flow systems, it has been difficult to simply adopt the chemistry used in batch preparations of semiconductor nanocrystals to a microfluidic flow reactor. There have been a few reports on the preparation of II-VI nanocrystals in flow systems, but these reports have not demonstrated the wide optical tunability, low polydispersities, and high quantum efficiencies attainable in the batch process, nor have they extracted new kinetic data on particle formation. See, for example, Chan et al., *Nano Letters* 2003, 3, 199–201, Nakamura et al., *Chem. Comm.* 2002, 2844–2845, and Edel et al., *Chem. Comm.* 2002, 1136–1137, each of which is hereby incorporated by reference in its entirety.

In general, the method of manufacturing a nanocrystal is a colloidal growth process. See, for example, U.S. Pat. Nos. 6,322,901 and 6,576,291, each of which is incorporated by reference in its entirety. Colloidal growth occurs by rapidly injecting an M-containing compound and an X donor into a hot coordinating solvent. The coordinating solvent can include an amine. The M-containing compound can be a metal, an M-containing salt, or an M-containing organometallic compound. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M-containing compound or X donor, the growth period can be shortened.

The M-containing salt can be a non-organometallic compound, e.g., a compound free of metal-carbon bonds. M is cadmium, zinc, magnesium, mercury, aluminum, gallium, indium, thallium, or lead. The M-containing salt can be a metal halide, metal carboxylate, metal carbonate, metal hydroxide, metal oxide, or metal diketonate, such as a metal acetylacetonate. The M-containing salt is less expensive and safer to use than organometallic compounds, such as metal alkyls. For example, the M-containing salts are stable in air, whereas metal alkyls are generally unstable in air. M-containing salts such as 2,4-pentanedionate (i.e., acetylacetonate (acac)), halide, carboxylate, hydroxide, oxide, or carbonate salts are stable in air and allow nanocrystals to be manufactured under less rigorous conditions than corresponding metal alkyls.

Suitable M-containing salts include cadmium acetylacetonate, cadmium iodide, cadmium bromide, cadmium chloride, cadmium hydroxide, cadmium carbonate, cadmium acetate, cadmium oxide, zinc acetylacetonate, zinc iodide, zinc bromide, zinc chloride, zinc hydroxide, zinc carbonate, zinc acetate, zinc oxide, magnesium acetylacetonate, magnesium iodide, magnesium bromide, magnesium chloride, magnesium hydroxide, magnesium carbonate, magnesium acetate, magnesium oxide, mercury acetylacetonate, mercury iodide, mercury bromide, mercury chloride, mercury hydroxide, mercury carbonate, mercury acetate, aluminum acetylacetonate, aluminum iodide, aluminum bromide, aluminum chloride, aluminum hydroxide, aluminum carbonate, aluminum acetate, gallium acetylacetonate, gallium iodide, gallium bromide, gallium chloride, gallium hydroxide, gallium carbonate, gallium acetate, indium acetylacetonate, indium iodide, indium bromide, indium chloride, indium hydroxide, indium carbonate, indium acetate, thallium acetylacetonate, thallium iodide, thallium bromide, thallium chloride, thallium hydroxide, thallium carbonate, or thallium acetate.

Alkyl is a branched or unbranched saturated hydrocarbon group of 1 to 100 carbon atoms, preferably 1 to 30 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. Optionally, an alkyl can contain 1 to 6 linkages selected from the group consisting of —O—, —S—, -M- and —NR— where R is hydrogen, or $C_1$–$C_8$ alkyl or lower alkenyl.

Prior to combining the M-containing salt with the X donor, the M-containing salt can be contacted with a coordinating solvent to form an M-containing precursor. Typical coordinating solvents include alkyl phosphines, alkyl phosphine oxides, alkyl phosphonic acids, or alkyl phosphinic acids; however, other coordinating solvents, such as pyridines, furans, and amines may also be suitable for the nanocrystal production. Examples of suitable coordinating solvents include pyridine, tri-n-octyl phosphine (TOP) and tri-n-octyl phosphine oxide (TOPO). Technical grade TOPO can be used. The coordinating solvent can include a 1,2-diol or an aldehyde. The 1,2-diol or aldehyde can facilitate reaction between the M-containing salt and the X donor and improve the growth process and the quality of the nanocrystal obtained in the process. The 1,2-diol or aldehyde can be a $C_6$–$C_{20}$ 1,2-diol or a $C_6$–$C_{20}$ aldehyde. A suitable 1,2-diol is 1,2-hexadecanediol and a suitable aldehyde is dodecanal.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, elemental sulfur, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), sulfur, bis(trimethylsilyl)sulfide (($TMS)_2S$), a trialkyl phosphine sulfide such as (tri-n-octylphosphine) sulfide (TOPS), tris(dimethylamino) arsine, an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

The nanocrystal manufactured from an M-containing salt grows in a controlled manner when the coordinating solvent includes an amine. The amine in the coordinating solvent can contribute to the quality of the nanocrystal obtained from the M-containing salt and X donor. Preferably, the coordinating solvent is a mixture of the amine and an alkyl phosphine oxide in a mole ratio of 10:90, more preferably 30:70 and most preferably 50:50. The combined solvent can decrease size dispersion and can improve photoluminescence quantum yield of the nanocrystal. The preferred amine is a primary alkyl amine or a primary alkenyl amine, such as a $C_2$–$C_{20}$ alkyl amine, a $C_2$–$C_{20}$ alkenyl amine, preferably a $C_8$–$C_{18}$ alkyl amine or a $C_8$–$C_{18}$ alkenyl amine. For example, suitable amines for combining with tri-octylphosphine oxide (TOPO) include 1-hexadecylamine, or oleylamine. When the 1,2-diol or aldehyde and the amine are used in combination with the M-containing salt to form a population of nanocrystals, the photoluminescence quantum efficiency and the distribution of nanocrystal sizes are improved in comparison to nanocrystals manufactured without the 1,2-diol or aldehyde or the amine.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, both CdSe and CdS can be tuned in the visible region and InAs can be tuned in the infrared region.

A population of nanocrystals can have a narrow size distribution. The population can be monodisperse and can exhibit less than a 15% rms deviation in diameter of the nanocrystals, preferably less than 10%, more preferably less than 5%. Spectral emissions in a narrow range of between 10 and 100 nm full width at half max (FWHM) can be observed. Semiconductor nanocrystals can have emission quantum efficiencies of greater than 2%, 5%, 10%, 20%, 40%, 60%, 70%, or 80%.

The semiconductor forming the core of the nanocrystal can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, Inp, InAs, InSb, TlN, TlP, TlAs, TiSb, PbS, PbSe, PbTe, or mixtures thereof.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, charge carriers, i.e., electrons and holes, are confined in the core of the nanocrystal when in an excited state. Alternatively, the conduction band or valence band of overcoating material can have an energy intermediate between the energies of the conduction and valence bands of the core material. In this case, one carrier can be confined to the core while the other is confined to the overcoating material when in an excited state. See, for example, U.S. patent application Ser. No. 10/638,546, which is incorporated by reference in its entirety. The core can have an overcoating on a surface of the core. The overcoating can be a semiconductor material having a composition different from the composition of the core, and can have a band gap greater than the band gap of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The outer surface of the nanocrystal can include a layer of compounds derived from the coordinating agent used during the growth process. The surface can be modified by repeated exposure to an excess of a competing coordinating group to form an overlayer. For example, a dispersion of the capped nanocrystal can be treated with a coordinating organic compound, such as pyridine, to produce crystals which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Monodentate alkyl phosphines (and phosphine oxides; the term phosphine below will refer to both) can passivate nanocrystals efficiently. When nanocrystals with conventional monodentate ligands are diluted or embedded in a non-passivating environment (i.e., one where no excess ligands are present), they tend to lose their high luminescence. Typical are an abrupt decay of luminescence, aggregation, and/or phase separation. In order to overcome these limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

Oligomeric phosphines have more than one binding site to the nanocrystal surface, which ensures their high affinity to the nanocrystal surface. See, for example, for example, U.S. Ser. No. 10/641,292, filed Aug. 15, 2003, and U.S. Ser. No. 60/403,367, filed Aug. 15, 2002, each of which is incorporated by reference in its entirety. The oligomeric phosphine can be formed from a monomeric, polyfunctional phosphine, such as, for example, tris(hydroxypropyl)phosphine, and a polyfunctional oligomerization reagent, such as, for example, a diisocyanate. The oligomeric phosphine can be contacted with an isocyanate of formula R'-L-NCO, wherein L is $C_2$–$C_{24}$ alkylene, and R' has the formula

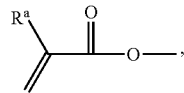

has the formula

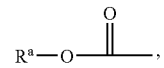

or R' is hydrogen, wherein $R^a$ is hydrogen or $C_1$–$C_4$ alkyl.

An overcoating process is described, for example, in U.S. Pat. No. 6,322,901, incorporated herein by reference in its entirety. By adjusting the temperature of the reaction mixture during overcoating and monitoring the absorption spectrum of the core, overcoated materials having high emission quantum efficiencies and narrow size distributions can be obtained. Alternatively, an overcoating can be formed by exposing a core nanocrystal having a first composition and first average diameter to a population of nanocrystals having a second composition and a second average diameter smaller than the first average diameter.

Size distribution during the growth stage of the reaction can be estimated by monitoring the absorption line widths of the particles. Modification of the reaction temperature in response to changes in the absorption spectrum of the particles allows the maintenance of a narrow particle size distribution during growth. Reactants can be added to the nucleation solution during crystal growth to grow larger crystals. By stopping growth at a particular nanocrystal average diameter, a population having an average nanocrystal diameter of less than 150 Å can be obtained. A population of nanocrystals can have an average diameter of 15 Å to 125 Å. The emission spectra of the nanocrystals can be tuned continuously over the wavelength range of 300 nm to 5 microns, or for example, when CdSe or CdTe is the core material, from 400 nm to 800 nm. IR-emitting semiconductor nanocrystals can be prepared according to methods described in, for example, U.S. patent application Ser. No. 10/638,546, which is incorporated by reference in its entirety.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystals in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum, if calibrated by a direct measurement of diameter, such as XRD or TEM.

The nanocrystals can be suitable for a variety of applications, including those disclosed in U.S. Pat. No. 6,251,303, U.S. Pat. No. 6,326,144, and U.S. Pat. No. 6,617,583, each of which is incorporated herein by reference in its entirety. For example, the nanocrystals can be used in optoelectronic devices including electroluminescent devices such as light emitting diodes (LEDs) or alternating current thin film electroluminescent devices (ACTFELDs).

CdSe is probably the most well characterized colloidal semiconductor nanocrystal system because its effective band gap can be tuned over the majority of the visible region. However, existing preparations are generally not amenable to a continuous flow system. In the most widely used preparation of high quality CdSe nanocrystals, dimethyl cadmium and tri-n-octylphosphine selenide (TOPSe) are rapidly injected into a hot solvent consisting of a mixture of tri-n-octylphospine (TOP) and tri-n-octylphosphine oxide (TOPO). See, for example, Murray et al., *J. Am. Chem. Soc.* 1993, 115, 8706–8715. The solvent also serves as the source of surface ligands for the growing nanocrystals. This method ensures that nucleation occurs very rapidly, followed by slower particle growth on existing nuclei, and the particles produced can be reasonably monodisperse and crystalline. Several difficulties arise when this chemistry is implemented in a continuous flow system, the most obvious one being that the solvent can be a solid at room temperature. Also, when $(CH_3)_2Cd$ is used as a precursor, gas is rapidly evolved in the reaction, which can make it difficult to achieve reproducible reactor residence times. Finally, at the high reaction temperatures, TOPO can decompose and lead to clogging of the reactor channel, a challenge that is only exacerbated as the channel dimensions are made smaller. Therefore, it was necessary for us to develop a new chemistry for CdSe nanocrystal synthesis that is more compatible with a microfluidic flow system. Guided by several recent reports on the preparation of semiconductor nanocrystals, cadmium oleate and TOPSe were chosen as the Cd and Se sources, respectively. See, for example, Murray et al., *IBM J. Res. & Dev.* 2001, 45, 47–56, Qu et al., *Nano Lett.* 2001, 1, 333–337, Peng et al., *J. Am. Chem. Soc.* 2001, 123, 183–184, and Bawendi et al., US Patent Application 20020071952, each of which is incorporated by reference in its entirety. These precursors can be dissolved in a high-boiling solvent system consisting of squalane, oleyl amine, and TOP. Advantageously, this choice of precursors and solvent reduces or eliminates problems of outgassing and clogging within the reactor channel, making it possible to use a simple capillary reactor to prepare CdSe nanocrystals with excellent size distributions and high photoluminescence (PL) quantum efficiencies. The continuous flow system can be used to tune the band-edge absorbance, for example, by varying the average nanocrystal size, over a substantial range.

Referring to FIG. 1A, a continuous flow reactor 10 includes a mixer 12 connected to a reaction conduit 14. Mixer 12 can be a miniature convective mixing chamber and reaction conduit 14 can be a heated glass reaction channel (250 micrometer I.D.). Reaction conduit can have a reaction zone 16 that is heated to a constant temperature. For example, reaction zone 16 can be maintained at a constant temperature of between 180 and 320° C. M source 20 and X source 22 provide the M and X precursor solutions, respectively, that are delivered in two separate flow paths 24 and 26, respectively, and combined in the mixer 12 before reaching the reaction zone. The reaction zone can be a flow zone. As the mixture exits the reaction zone 16 to growth stopping zone 30, the mixture cools rapidly, limiting or substantially stopping growth of the nanocrystals. The nanocrystals are then collected.

Mixing can be substantially completed prior heating in the reaction zone. The presence of the mixing chamber can be important because once the M (e.g., Cd) and X (e.g., Se) precursor solutions are combined at room temperature, small MX (e.g., CdSe) clusters form over several hours. The small clusters can result in irreproducibility in the sizes of the final nanocrystals produced by the reactor so the Cd and Se precursors could not be mixed until just prior to reaching the heated section. The volume of the mixer can be selected such that the chamber residence time was long enough to ensure complete mixing but short enough to avoid formation of small clusters. For example, when the reaction conduit has an inner diameter of 250 micrometer I.D., a mixer having a volume of 30 microliters can have a residence time of 1 to 15 minutes, depending on flow rate. This configuration of reactor can have excellent stability, as demonstrated by continuously flowing precursors through the reactor for 8 hour to produce nanocrystals. Absorbance spectra taken of the nanocrystals sampled during these long runs were indistinguishable from each other.

By systematically varying the temperature, flow rate, and concentration it was possible to finely tune the size of nanocrystals produced in the reactor. FIGS. 1B–D summarize results for a fixed precursor composition. Average nanocrystal radii were determined from the position of the band-edge absorbance peak and calibration curves based on TEM and X-ray scattering results. See, for example, Murray et al., *J. Am. Chem. Soc.* 1993, 115, 8706–8715, Mattoussi et al., *Phys. Rev. B* 1998, 58, 7850–7863, and Kuno, Ph.D. thesis, Massachusetts Institute of Technology, 1998, each of which is incorporated by reference in its entirety. The reaction yield and number of nuclei/volume were determined from the optical density and absorbance cross-section at 350 nm as previously reported. See, for example, Leatherdale et al., *J. Phys. Chem. B* 2002, 106, 7619–7622. Here, it was assumed that the number of dots is equal to the number of nuclei, which is true as long as growth does not proceed extensively by an Ostwald ripening mechanism. In Ostwald ripening, the concentration of monomers is low enough that smaller dots dissolve at the expense of larger dots, and we would observe a decrease in the number of dots with sufficiently long growth time. In all of the data presented here, the residence time was kept short enough so that this process did not occur. As expected, higher reaction yields were observed and the production of larger nanocrystals as the residence time or temperature is increased.

Representative spectra for samples prepared at a constant temperature (FIG. 2A) or constant flow rate (FIG. 2C) illustrate some important general trends. Though the average nanocrystal size can be tuned by changing the reactor conditions, a corresponding variation in the size distribution of samples produced was observed (FIGS. 2B and 2D). In particular, the ratio of the size distribution to average radius ($\sigma_r/r_{avg}$) becomes unacceptably large (>10%) at extremes of low temperatures or high flow rates. At the other extremes, as explained below, the kinetics of nucleation and growth place an upper limit on the temperature and a lower limit on the flow rate. In other words, changing reactor conditions makes it possible to vary the average nanocrystal size over a wide range, but only at the expense of increasing polydispersity. Given the relatively narrow range of monodisperse sizes available by simply changing the reactor conditions, we sought to access a larger range by systematically varying the precursor concentration.

Figure 3C:
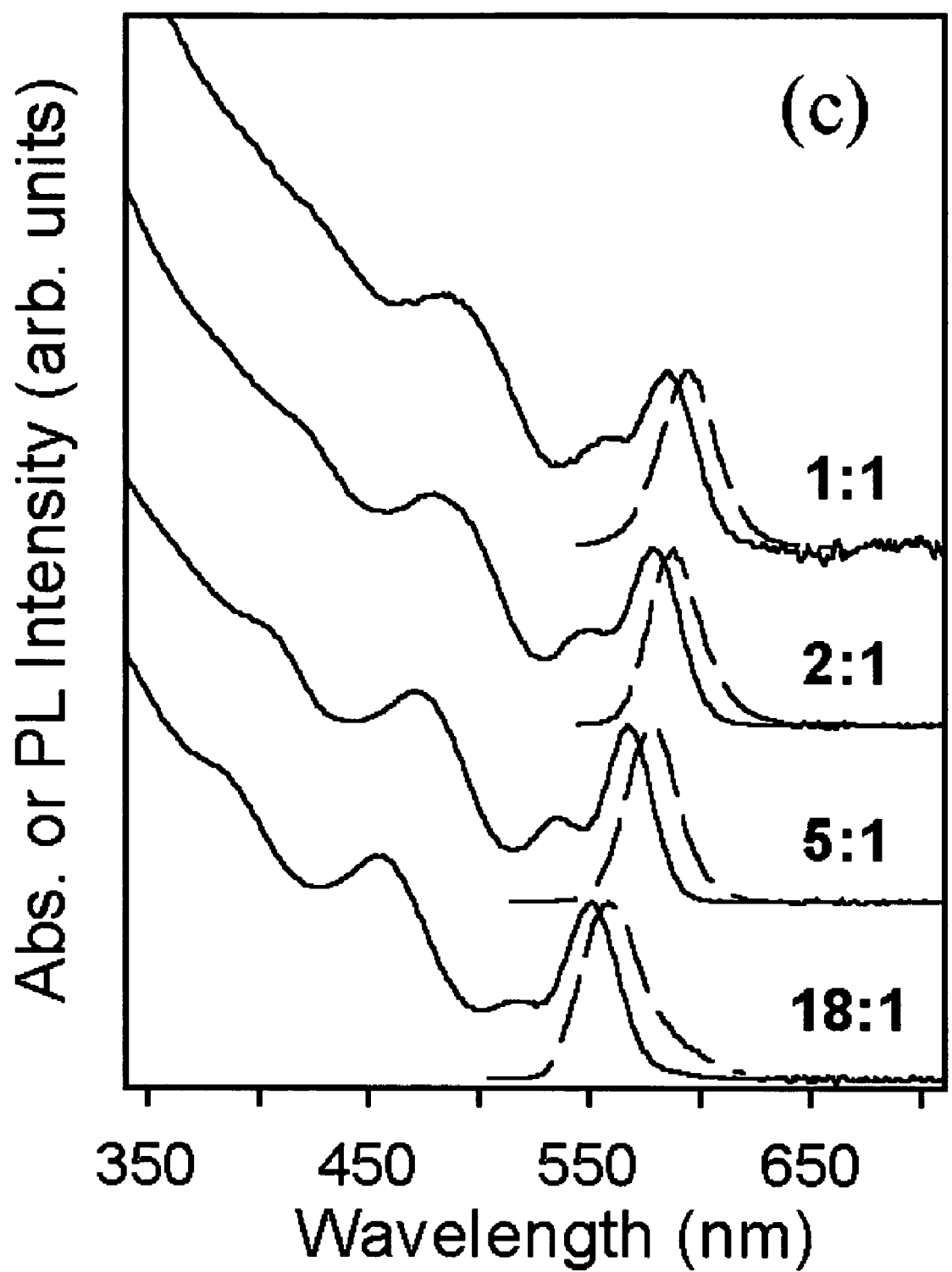
FIG. 3C is a graph depicting absorbance and photoluminescence spectra for nanocrystals collected at $\tau$=144 seconds.

FIG. 3A illustrates that increasing the TOPSe concentration, while keeping the cadmium oleate concentration constant, leads to a dramatic increase in the number of nuclei that are formed. With more (fewer) nuclei on which to grow, smaller (larger) dots are formed, and the position of the first absorbance peak shifts accordingly (FIG. 3C). By controlling the nucleation event, it is possible to rationally tune the effective band gap of the nanocrystals continuously over a substantial range while maintaining excellent size distributions.

Figure 4:
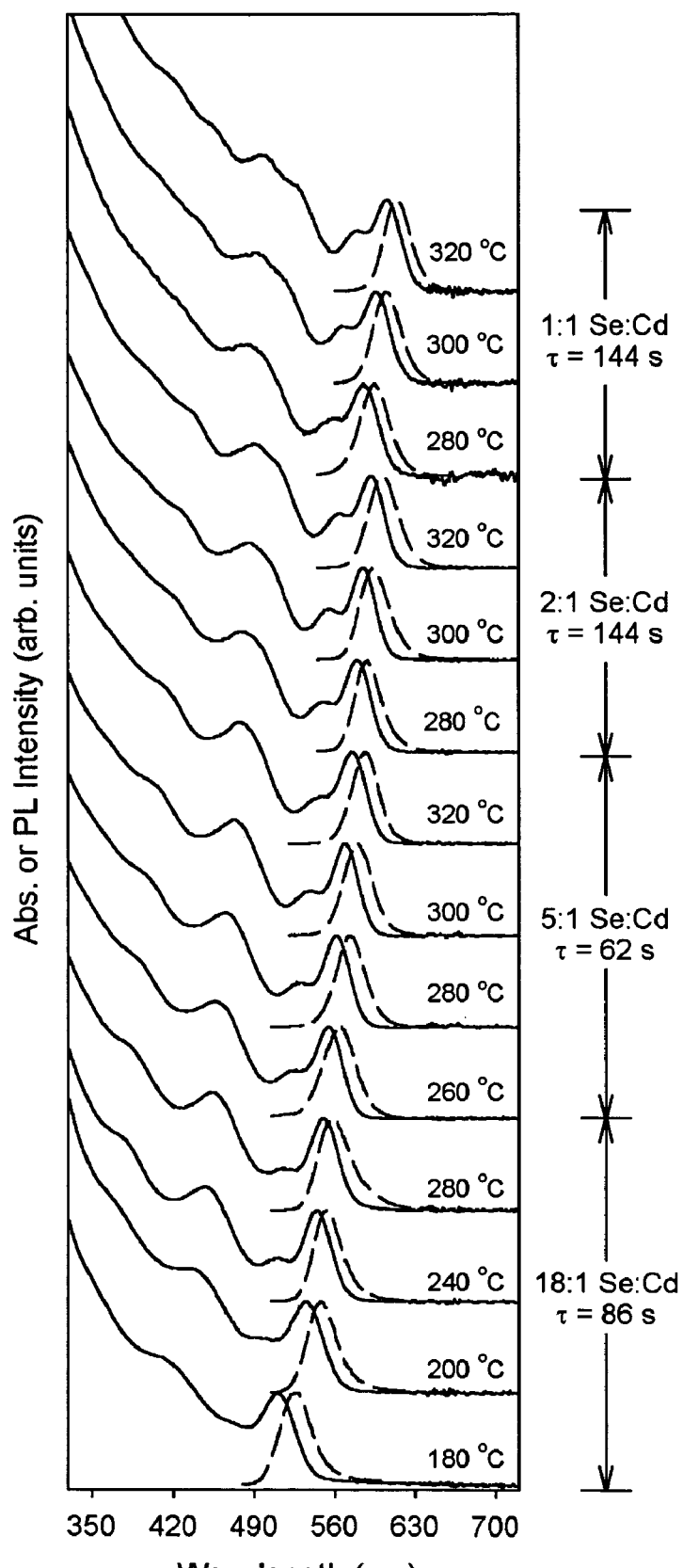
FIG. 4 is a graph depicting size series for nanocrystal samples prepared using four different Se:Cd ratios.

FIG. 4 shows the absorbance and photoluminescence spectra of a size series of nanocrystals with absorbance maxima ranging from 510 to 606 nm (average radii from ~1.5 to ~2.7 nm). Four TOPSe concentrations (1:1, 2:1, 5:1, and 18:1 Se:Cd) were used to obtain the size series shown. By controlling the number of nuclei systematically with concentration, we were able to access four size ranges, and within each range, the temperature and flow rates were varied to more finely tune the average nanocrystal size. The high photoluminescence quantum efficiencies (between 28–51%), primarily due to the presence of amines, and the narrow emission peak widths (full-width-half-maximum between 27–34 mm) indicate the excellent quality of the samples shown in FIG. 4.

An important result described above is the variation of the size distribution with temperature or flow rate. Understanding this trend provides insight into reactor design issues and underlying nucleation and growth processes. For instance, FIGS. 2A and 2B show that the size distribution becomes unacceptably broad as the flow rate is increased (reaction time decreased). Nonuniformity of reaction conditions across the channel can contribute to broadening of the size distribution. A straightforward calculation shows that upon entering the heated section, the fluid at the center of the channel heats to within 5C of the target temperature in ~0.5 seconds. See for example, Edadian et al., in *Handbook of Heat Transfer*, 3rd ed. (Eds.: W. M. Rohsenow, J. P. Hamett, Y. I. Cho), McGraw Hill, New York 1998, Ch. 5, and Sellars et al., *Trans. A.S.M.E.* 1956, 78, 441–448, each of which is incorporated by reference in its entirety. Here estimates of 0.1 W m$^{-1}$ K$^{-1}$, 0.9 g cm$^{-3}$, and 3 J g$^{-1}$K$^{-1}$ for the fluid thermal conductivity, density, and heat capacity, respectively, were used. The boundary condition that the fluid at the channel wall was at a constant 25° C. before the heated region and a constant 320° C. within the heated region was used. Given such a rapid rate of heating, the dispersion in reaction conditions appears to be dominated by the residence time distribution (RTD). For laminar flow in a cylindrical channel, the flow takes on a parabolic velocity profile so that nanocrystals in the center move faster than those near the channel wall. Superimposed on this flow profile is the radial diffusion of nanocrystals across the channel, and the combination gives rise to a distribution of residence times experienced by nanocrystals exiting the reaction section.

Some results from examples are summarized in FIGS. 1–4. FIG. 1A representes a schematic of the capillary reactor. FIGS. 1B–1D represent results for nanocrystals prepared using a 1:1 Se:Cd precursor composition, in which T is the residence time in the heated section. The spectra, average radii (ravg), and size distributions for samples represented by the diamonds in this figure are shown in FIGS. 2A and 2B. A similar data set for samples along the dashed line is shown in FIGS. 2C and 2D.

FIG. 2A represents absorbance and photoluminescence spectra for samples produced at various flow rates while keeping temperature (320° C.) and precursor concentration (1:1 Se:Cd) constant. FIG. 2B represents corresponding average nanocrystal size and size distribution (sr) of the samples represented in FIG. 2A. FIG. 2C represents spectra for samples prepared at various temperatures while keeping the flow rate ($\tau$=144 seconds) and precursor concentration constant. FIG. 2D represents corresponding average nanocrystal size and width of the size distribution of the samples represented in FIG. 2C. The size distribution of each sample was determined from the photoluminescence peak width assuming a linewidth of ~50 meV for the emission of a single nanocrystal at room temperature. Calculated size distributions are approximate because they depend on the choice of the single nanocrystal emission linewidth, but the trends shown in the figure are correct.

FIG. 3A shows the dependence of the number of nuclei on the concentration of TOPSe for a reactor temperature of 280° C. The cadmium oleate concentration was fixed. FIG. 3B shows the corresponding reaction yields for the reaction conditions in FIG. 3A. FIG. 3C represents the absorbance and photoluminescence spectra for samples along the dashed line ($\tau$=144 seconds). From bottom to top, the positions of the band-edge absorbance peaks in nm (and average nanocrystal radii in nm) are as follows: 552 (1.99), 568 (2.19), 579 (2.32), 586 (2.40).

FIG. 4 represents size series for samples prepared using four TOPSe concentrations—1:1 Se:Cd, 2:1 Se:Cd, 5:1 Se:Cd, and 18:1 Se:Cd. For each TOPSe concentration, the average nanocrystal size was controlled by varying the temperature at a fixed flow rate. From bottom to top, the positions of the band-edge absorbance peaks in nm (and average nanocrystal radii in nm) are as follows: 510 (1.52), 535 (1.78), 545 (1.90), 551 (1.98), 555 (2.03), 561 (2.10), 569 (2.20), 575 (2.27), 579 (2.32), 585 (2.39), 592 (2.48), 586 (2.40), 597 (2.55), 606 (2.70).

The residence time $\tau$ shown in FIGS. 1–3, for example, is technically an average residence time. The width of the RTD function ($\sigma_t$) can be estimated using the Taylor dispersion model. See, for example, Fogler, in *Elements of Chemical Reaction Engineering*, 3$^{rd}$ ed., Prentice Hall, Upper Saddle River, N.J. 1999, Levenspiel, in *Chemical Reaction Engineering*, 3$^{rd}$ ed., Wiley, N.Y. 1999, each of which is incorporated by reference in its entirety. In this model, the extent of dispersion in residence times is characterized by a dispersion coefficient, $$D^* = \frac{u^2 R^2}{48D},$$

where R is the radius of the channel, u is the average flow velocity, and D is the diffusion coefficient. D was estimated using the Stokes-Einstein equation. The fluid viscosity was extrapolated from experimental values for squalane (see, Krahn et al., *J. Chem. Eng. Data* 1994, 39, 670–672, which is incorporated by reference in its entirety) using a modified Arrhenius expression. From $\sigma_t$ and the size vs. time curve (FIG. 2B, triangles), the RTD contribution to the overall size distribution was calculated. At shorter times, the RTD effect is significant, accounting for ~60% of the overall size distribution for τ=14 s. At longer times, the RTD effect becomes negligible, accounting for <10% of the overall size distribution for the longest r shown in the figure (144 seconds). This analysis partially explains the narrowing of the overall size distribution with increased reaction time. Introducing a segmented, rather than a homogeneous flow, into the reactor can reduce the dispersion in the RTD. In such an approach, the flow is comprised of small, alternating segments of two different phases moving through the heated section. Each segment behaves essentially like a miniature stirred tank reactor, so that molecules within each segment experience a very uniform RTD.

In a previous report on the preparation of CdSe nanocrystals with a flow system (Nakamura et al., *Chem. Comm.* 2002, 2844–2845, which is incorporated by reference in its entirety), researchers used a segmented flow by introducing $N_2$ bubbles into the precursor stream, and they observed somewhat improved size distributions in comparison to the homogeneous flow case. Similar results can be obtained when a lower boiling solvent, di-n-octyl ether rather than squalane, is used. At temperatures greater than 280° C., the solvent boils within the heated section, forming alternating segments of gas and liquid within the channel. However, it can be difficult to estimate the flow velocity of the fluid in the heated region due to the nature of the bubble formation. In certain circumstances, it can be possible to more controllably introduce a gas phase into the liquid precursor stream. For example, discrete volumes of a gas, preferably an inert gas such as nitrogen, argon or helium, can be introduced at regular intervals into the stream. The underlying kinetics of nanocrystal formation can play an important role in the observed size distributions in FIG. 2C. Under certain conditions, there is a natural distribution in growth rates with size that results in narrowing of the size distribution. See, for example, Sugimoto, *Adv. Coll. Int. Sci.* 1987, 28, 65–108, which is incorporated by reference in its entirety. For steady-state, diffusion-controlled growth of a spherical particle, it can be shown that the growth rate (dr/dt) as a function of particle radius (r) has a maximum at a critical radius $r_{cr}$. For $r>r_{cr}$, the growth rate decreases with increasing radius (smaller particles grow faster than larger ones), and the size distribution narrows with time. For $r<r_{cr}$, smaller particles grow slower or even dissolve compared to larger particles (Ostwald ripening), and this leads to broadening of the size distribution. If the growth rate is also dictated by reaction at the surface (mixed diffusion and reaction control), the growth rate can still have a maximum at some critical radius, and the curve still exhibits focusing and defocusing regions. See, for example, Talapin et al., *J. Phys Chem. B* 2001, 105, 12278–12285, which is incorporated by reference in its entirety. These arguments have been used to explain the observed narrowing and subsequent broadening of the size distribution during the batch synthesis of semiconductor nanocrystals. See, for example, Peng et al., *J. Am. Chem. Soc.* 1998, 120, 5343–5344. In such a preparation, the supersaturation of monomers can be high early in the growth so that essentially all of the particle sizes are larger than $r_{cr}$, and the size distribution sharpens. As the growth continues and concentration of monomers is depleted, $r_{cr}$ increases so that eventually all of the sizes are less than $r_{cr}$, and the size distribution broadens. For nanocrystals prepared in a flow reactor, the combination of the RTD and growth focusing/defocusing define an optimal range of flow rates that can produce monodisperse samples. For times shorter than this range, the dispersion in residence times is large, and the growth focusing does not proceed long enough to compensate, resulting in poor quality samples. For very short times, nucleation can be incomplete, further broadening the size distribution. For times longer than the optimal range, the concentration of monomer decreases enough so that growth proceeds by Ostwald ripening and the size distribution begins to broaden. Under some conditions, such as a very broad initial size distribution, it is possible for Ostwald ripening to lead to narrowing of the size distribution. See, for example, Talapin et al., *J. Phys. Chem. B* 2001, 105, 12278–12285.

The dependence of size distribution on temperature (FIG. 2D) can also be explained from kinetic arguments, in particular from the nucleation data shown in FIG. 1D. With the exception of the 240° C. curve, the number of nuclei increases with time and then saturates to a constant value. This is consistent with existing nucleation and growth models in which nanocrystal formation proceeds by a simultaneous nucleation and growth period followed by purely growth on existing nuclei. Since the kinetics of nucleation and growth are strongly temperature dependent, the formation of nuclei (the rising portion of the curves in FIG. 1D) takes substantially longer as the temperature is lowered. In fact, at 240° C., the nucleation is slowed so much that even at the longest residence time shown (216 seconds), nucleation is incomplete, and the curve does not saturate. Therefore, at lower temperatures, the kinetics can be slowed to such an extent that the majority or all of the residence time is characterized by mixed nucleation and growth (the curves in FIG. 1D have not saturated), resulting in poor size distributions. At high temperatures, nucleation ends quickly so that the majority of the time spent in the heated section is purely characterized by growth focusing. Another important observation is that the curves in FIG. 1D approach essentially the same value. In other words, changing the temperature affects the rate of nucleation, but the final number of nuclei formed remains essentially constant. Thus, with this precursor chemistry, there can be a limit on the range of sizes that may be accessed by changing the temperature.

In order to access a larger size range while maintaining acceptable size distributions, we systematically varied the concentration of the TOPSe precursor (FIG. 3). Increasing the TOPSe concentration slows the growth rate relative to the nucleation rate, resulting in formation of a larger number of nuclei as shown in FIG. 3A, which summarizes the effect of varying the TOPSe concentration while keeping the cadmium oleate concentration and reactor temperature (280° C.) constant. Also, a higher TOPSe concentration resulted in faster overall reaction kinetics as indicated by higher reaction yields (FIG. 3B). This is due to two effects: first, a higher concentration of precursors results in faster overall kinetics, and secondly, a higher concentration of nuclei on which to grow results in faster depletion of monomers in solution.

In summary, a combination of the RTD and intrinsic nucleation and growth processes place restrictions on the range of sizes that can be accessed for a given precursor concentration. By changing the TOPSe concentration, it is possible to control the nucleation rate, thereby enabling us to use a simple capillary reactor to produce high quality CdSe nanocrystals with sizes corresponding to a wide spectral range. The continuous flow system can serve as a powerful kinetic tool for elucidating nanocrystal nucleation and growth kinetics. The arguments used to describe the nucleation and growth process and the corresponding variations in size distribution can be applied generally.

EXAMPLES

A Cd precursor solution, the Cd source, was prepared by heating a suspension of 74.8 mg (0.5 mmol) Cd(OH)$_2$, 350 microliters (2.2 mmol) oleic acid (cis-9-octadecenoic acid), and 9 mL squalane (2,6,10,15,19,23-hexamethyltetracosane) at 150° C. under vacuum. After approximately 10 minutes, the solution became optically clear, at which point the temperature was lowered to 100° C. The solution was further degassed for at least 90 minutes to remove any excess water. Upon cooling to room temperature, 4 mL oleyl amine (cis-1-amino-9-octadecene) were added. The Se precursor solution was prepared by diluting a portion of a 1.5 M TOPSe/TOP stock solution in squalane. The 1.5 M TOPSe/TOP stock solution was prepared as reported in Murray et al., *J. Am. Chem. Soc.* 1993, 115, 8706–8715. All of the above manipulations were performed under a dry N$_2$ atmosphere.

The reactor consisted of a length of glass tubing with a 250 micrometer channel diameter placed inside an aluminum heating chuck. Heating was provided by cartridge heaters inserted within the aluminum block, and the temperature was monitored using a small thermocouple inserted next to the glass tubing. The total length of the heating section was 14.6 cm. In order to prevent formation of bubbles in the heated section, the Cd and Se precursor solutions were thoroughly degassed at 90° C. before being carefully drawn into syringes. The precursor solutions were then delivered in two separate flows with syringe pumps. After combining the two flows with a tee, the fluid reached a miniature convective mixing chamber containing a magnetic stir bar. After the mixing chamber, the precursors flowed into the heated section, where they quickly reacted to form nanocrystals. The nanocrystal solution was then collected for absorption and photoluminescence measurements.

Optical absorption spectra were acquired using a Hewlett-Packard 8453 diode array spectrometer. Photoluminescence spectra were acquired using a SPEX Fluorolog 1680 spectrometer, using right-angle collection. Samples were prepared by diluting the raw nanocrystal solutions in hexanes. Quantum yields were determined by comparing the integrated emission of a given nanocrystal sample solution with that of an appropriate reference dye. The following reference dyes (and quantum yields) were used: Rhodamine 560 chloride in basic ethanol (92%), Rhodamine 590 chloride in methanol (89%), Rhodamine 610 chloride in methanol (57%), and Rhodamine 640 perchlorate in methanol (100%).

A number of embodiments have been described. Nevertheless, it will be understood that various modifications may be made without departing from the spirit and scope of the invention. For example, the methods and products described herein primarily related to methods of preparing cadmium selenide or zinc sulfide materials. However, it will be apparent to those skilled in the art that these methods can be extended to other nanocrystals, such as other metal chalcogenide and pnictide materials. Accordingly, other embodiments are within the scope of the following claims.

What is claimed is:

1. A method of manufacturing a population of nanocrystals, comprising:
heating a mixture of an M-source and an X donor in a fluid in a reaction zone to a growth temperature for a preselected amount of time; and
cooling the mixture below the growth temperature to stop growth of the nanocrystals.

2. A method of manufacturing a population of nanocrystals, comprising:
combining an M-source and an X donor in a fluid in a mixing region to form a mixture;
transporting the mixture through a reaction zone, the mixture being heated in the reaction zone to a temperature for a time sufficient to grow a nanocrystal; and
transporting the mixture from the reaction zone to a growth stopping zone to form the population of nanocrystals.

3. The method of claim 2 wherein the M-source is an M-containing salt.

4. The method of claim 3, wherein M is Cd, Zn, Mg, Hg, Al, Ga, In, or Tl and X is O, S, Se, Te, N, P, As, or Sb.

5. The method of claim 3, wherein the M-containing salt is a halide, carboxylate, carbonate, hydroxide, or diketonate.

6. The method of claim 3, wherein the M-containing salt is cadmium acetylacetonate, cadmium iodide, cadmium bromide, cadmium chloride, cadmium hydroxide, cadmium carbonate, cadmium acetate, cadmium oxide, zinc acetylacetonate, zinc iodide, zinc bromide, zinc chloride, zinc hydroxide, zinc carbonate, zinc acetate, zinc oxide, magnesium acetylacetonate, magnesium iodide, magnesium bromide, magnesium chloride, magnesium hydroxide, magnesium carbonate, magnesium acetate, magnesium oxide, mercury acetylacetonate, mercury iodide, mercury bromide, mercury chloride, mercury hydroxide, mercury carbonate, mercury acetate, aluminum acetylacetonate, aluminum iodide, aluminum bromide, aluminum chloride, aluminum hydroxide, aluminum carbonate, aluminum acetate, gallium acetylacetonate, gallium iodide, gallium bromide, gallium chloride, gallium hydroxide, gallium carbonate, gallium acetate, indium acetylacetonate, indium iodide, indium bromide, indium chloride, indium hydroxide, indium carbonate, indium acetate, thallium acetylacetonate, thallium iodide, thallium bromide, thallium chloride, thallium hydroxide, thallium carbonate, or thallium acetate.

7. The method of claim 6, further comprising cooling the mixture in the growth stopping zone.

8. The method of claim 2, wherein the mixture includes an amine.

9. The method of claim 8, wherein the amine is a primary amine.

10. The method of claim 9, wherein the primary amine is a $C_8$–$C_{20}$ alkyl amine.

11. The method of claim 8, wherein the primary amine is a $C_8$–$C_{20}$ alkyl amine, the 1,2-diol is a $C_6$–$C_{20}$ alkyl diol, and the M-source is an M-containing salt, the M-containing salt being a halide, carboxylate, carbonate, hydroxide, or diketonate.

12. The method of claim 11, wherein the X donor includes a phosphine chalcogenide, a bis(silyl) chalcogenide, dioxygen, an ammonium salt, or a tris(silyl) pnictide.

13. The method of claim 2, wherein combining the M-source and the X donor includes contacting a metal, M, or an M-containing salt, and a reducing agent to form an M-containing precursor.

14. The method of claim 13, wherein the reducing agent includes an alkyl phosphine, a 1,2-diol or an aldehyde.

15. The method of claim 14, wherein the 1,2-diol is a $C_6$–$C_{20}$ alkyl diol or the aldehyde is a $C_6$–$C_{20}$ aldehyde.

16. The method of claim 2, wherein a nanocrystal in the population photoluminesces with a quantum efficiency of at least 10%.

17. The method of claim 2, further comprising selecting a ratio of the M-source and the X donor to grow the population of nanocrystals to have a predetermined average size.

18. The method of claim 2, further comprising selecting the temperature of reaction zone to grow the population of nanocrystals to have a predetermined average size.

19. The method of claim 2, further comprising selecting a ratio of the M-source and the X donor and the temperature of reaction zone to grow the population of nanocrystals to have a predetermined average size.

20. The method of claim 2, wherein the population of nanocrystals has an average particle size in the range of about 20 Å to about 125 Å.

21. The method of claim 2, wherein the fluid includes a coordinating solvent.

22. The method of claim 2, wherein the population of nanocrystals is monodisperse.

23. The method of claim 2, further comprising forming an overcoating of a semiconductor material on a surface of a nanocrystal in the population.

24. The method of claim 2, wherein the population emits light in a spectral range of no greater than about 75 nm full width at half max (FWHM).

25. The method of claim 2, wherein the population exhibits less than a 15% rms deviation in diameter of the nanocrystal.

26. The method of claim 2, wherein transporting the mixture includes flowing the mixture through a conduit.

27. The method of claim 2, further comprising introducing a gas phase into the mixture during transport.

28. The method of claim 2, wherein transporting the mixture includes segmented flowing of the mixture through a conduit.

29. The method of claim 2, wherein the temperature is between 150 and 350° C.

30. The method of claim 2, wherein the time is less than 5 minutes.

* * * * *